(12) United States Patent
Uchida (10) Patent No.: US 7,200,294 B2
(45) Date of Patent: Apr. 3, 2007

(54) LIGHT-TRANSMITTING MODULE CAPABLE OF HEATING THE LIGHT-EMITTING MODULE AND THE SUBSTRATE INCLUDED THEREIN

(75) Inventor: Kenichiro Uchida, Kanagawa (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 98 days.

(21) Appl. No.: 10/807,509

(22) Filed: Mar. 24, 2004

(65) Prior Publication Data
US 2004/0240800 A1 Dec. 2, 2004

(30) Foreign Application Priority Data
Mar. 27, 2003 (JP) ............................. 2003-088155

(51) Int. Cl.
G02B 6/12 (2006.01)
G02B 6/26 (2006.01)
G02F 6/035 (2006.01)
H01S 3/04 (2006.01)

(52) U.S. Cl. ............................. 385/14; 385/40; 385/2; 372/34

(58) Field of Classification Search .................. 385/92, 385/8, 94; 372/34
See application file for complete search history.

(56) References Cited

U.S. PATENT DOCUMENTS 5,033,809 A * 7/1991 Shiga ........................... 385/51
5,214,660 A * 5/1993 Masuko et al. ................ 372/34
5,488,625 A * 1/1996 Nakamori et al. ......... 372/50.1
6,865,199 B2* 3/2005 Miguelez et al. ............. 372/34
2003/0034450 A1* 2/2003 Karger et al. ................ 250/288
2003/0072337 A1* 4/2003 Miguelez et al. ............. 372/34

FOREIGN PATENT DOCUMENTS

| JP | 55-001119 | 1/1980 |
| JP | A-S58-175655 | 11/1983 |
| JP | 61-216381 | 9/1986 |
| JP | 2002-252576 A | 9/2000 |

OTHER PUBLICATIONS

Japanese Office Action for corresponding application No. JP 2003-088155 dispatched Nov. 1, 2005.

* cited by examiner

Primary Examiner—Kaveh Kianni
(74) Attorney, Agent, or Firm—McDermott Will & Emery LLP (57) ABSTRACT

The present invention provides a light-transmitting module capable of emitting light in stable under a predetermined temperature, especially the light-transmitting module applicable to a condition when the predetermined temperature is lower than ambient temperatures. The light-transmitting module of the present invention includes a light-emitting module, which encloses the laser diode and the Peltier device therein, a substrate electrically connected to the light-emitting module, and a heater. The heater is able to heat the package of the light-emitting module when the predetermined temperature of the laser diode is higher than the ambient temperature, thereby preventing the temperature of the package from lowering the dew-point and droplets from being generated on the substrate. The optical output from the light-transmitting module can be stabled.

13 Claims, 9 Drawing Sheets

LIGHT-TRANSMITTING MODULE CAPABLE OF HEATING THE LIGHT-EMITTING MODULE AND THE SUBSTRATE INCLUDED THEREIN

BACKGROUND OF THE INVENTION

1. Field of the Invention

The present invention relates to a light-transmitting module.

2. Related Prior Art

A laser diode (LD) is controlled in its temperature to emit light with a predetermined wavelength. Generally, the control of the temperature is performed by using a Peltie device, on which the LD is installed. Such configuration is disclosed in Japanese patent published by 2000-252576 and 61-215381.

The light-emitting module is assembled by installing the LD and Peltier device in the package, and the light-transmitting module includes such light-emitting module and a substrate on which various electronic components are mounted to control the LD and the Peltier device in the light-emitting module.

Generally, when the LD is operated, the temperature of the light-transmitting module rises due to the self-heating. Therefore, to keep the temperature of the LD to emit light at a predetermined wavelength, the LD should be cooled down by the Peltier device. However, when an ambient temperature is lower than the preset temperature of the LD, for example, the ambient temperature of the module is below the freezing point while the preset temperature of the LD is the room temperature, then the LD should be heated up. When the upper surface of the Peltier device, where the LD is mounted thereon, is heated up, the lower surface of the Peltier device is cooled down due to the Peltier effect.

However, in the case that the temperature of the package is lowered, the condensation may be brought in the outer surface of the package. The condensation causes the short circuit and the breaking of the wiring on the substrate, especially in the light-transmitting module having a hot plug configuration, the droplets of the condensation causes the trouble of the electrical connector. Therefore, the light-transmitting module can not emit light in stable and reliable.

Accordingly, one object of the present invention is to provide a light-transmitting module that enables to output light in stable and reliable even under a condition that an ambient temperature is lower than a preset temperature of the light-emitting device.

SUMMARY OF THE INVENTION

According to one aspect of the present invention, a light-transmitting module includes a light-emitting module, a substrate, a heater and a housing. The housing receives the light-emitting module, the substrate and the heater therein. The light-emitting module includes a laser diode and a Peltier device for controlling a temperature of the laser diode. The substrate installs a plurality of electronic elements thereon. The heater is disposed so as to heat up the light-emitting module and the substrate.

Since the heater enables to heat up the light-emitting module and the substrate, even when the laser diode is heated up by the Peltier device, which is equivalent to the case that the light-emitting module is cooled down, the light-emitting module and the substrate are prevented to lower temperatures below the dew-point.

The light-emitting module of the present invention may include a package having a CAN-type shape with a stem mounting the Peltier device thereon, a plurality of lead pins connected to the substrate and a thermistor for monitoring the temperature of the laser diode. The heater is preferably attached to the side surface of the stem. Alternatively, the heater is preferably installed on the substrate so as to in contact with the side surface of the stem or the heater is preferably installed on the substrate immediately by the lead pin.

According to another feature of the present invention, the light-emitting module may include a package having a box-shape with a pair of side walls and a rear wall, a plurality of lead pins connected to the substrate and a thermistor for monitoring the temperature of the laser diode. The heater is preferably installed on the substrate so as to in contact with the side wall or the rear wall. Alternatively, the heater is provided in an outer surface of the housing located under the box-shaped package.

The plurality of electronic elements may be a laser diode controller, a Peltier controller and a heater controller. The laser diode controller controls the laser diode such that an optical output of the laser diode is maintained to be a predetermined value. The heater controller compares an ambient temperature to a preset temperature of the laser diode and enables the heater when the preset temperature is higher than the ambient temperature. The Peltier controller controls the Peltier device so as to set the laser diode to be a preset temperature.

DETAILED DESCRIPTION OF PREFERRED EMBODIMENTS

Preferred embodiments of the present invention will be described as referring to accompanying drawings. In the drawings and the specification, same elements will be referred as the same numerals or symbols without overlapping explanation. Dimensions of the elements depicted in the drawings do not always reflect their real dimensions.

(First Embodiment)

Figure 1:
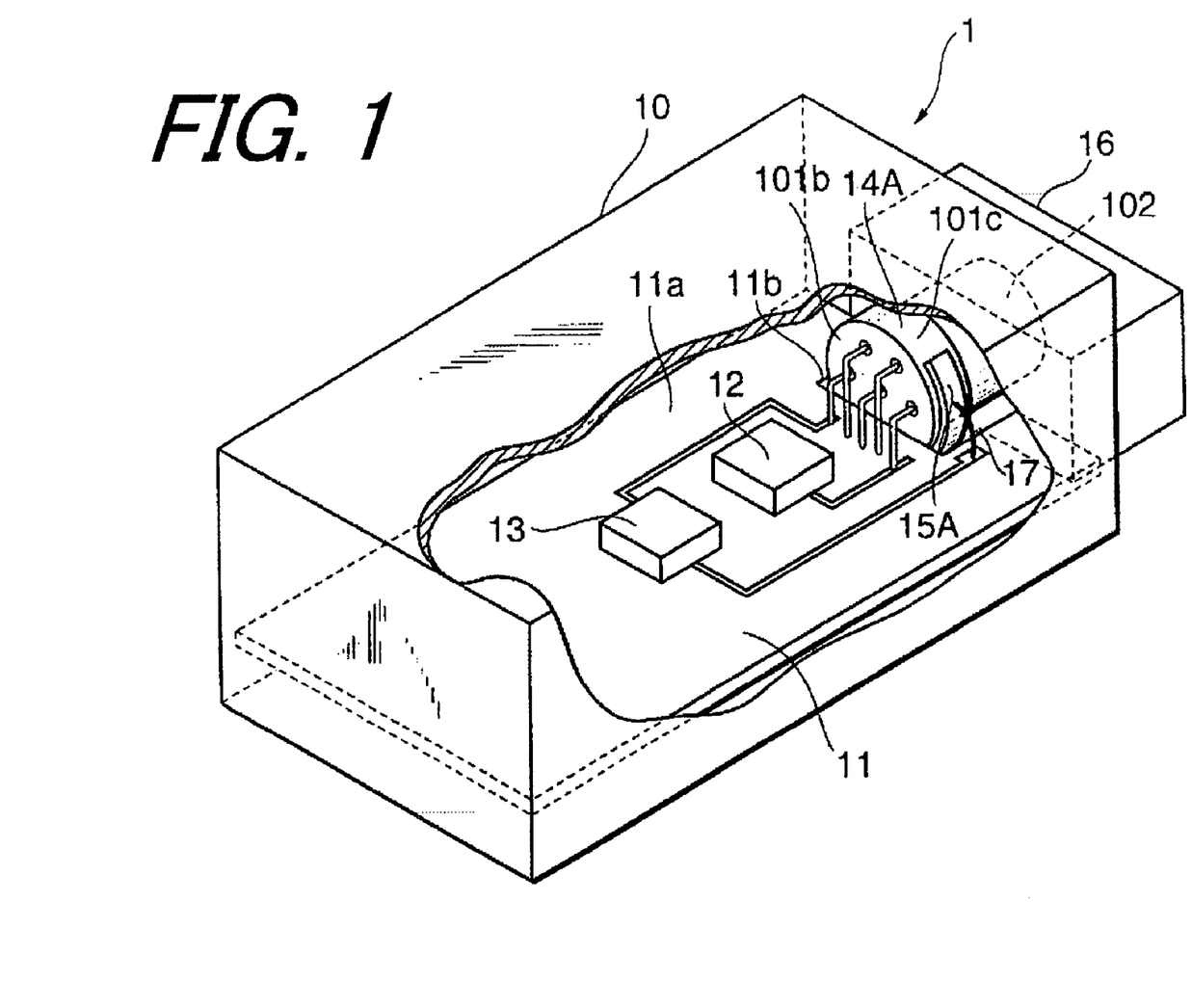
FIG. 1 is a perspective view showing a light-transmitting module according to the first embodiment of the present invention.
Figure 2A:
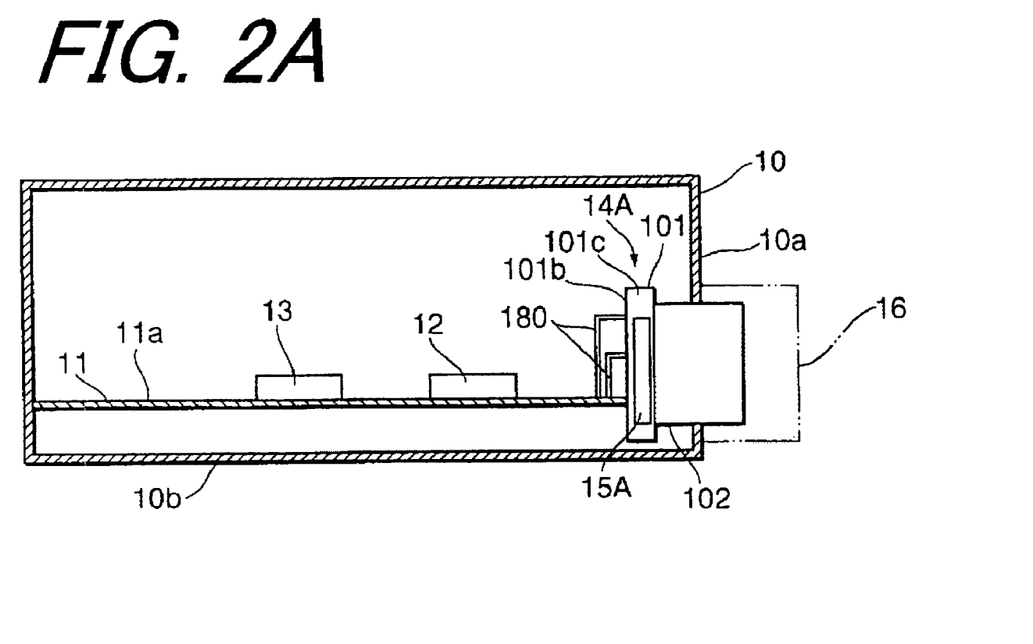
FIG. 2A is a schematic cross sectional view of the light-transmitting module shown in FIG. 1.

The first embodiment will be explained by referring to from FIG. 1 to FIG. 4. As shown in FIG. 1 and FIG. 2A, which schematically shows a cross sectional view, a light-transmitting module 1 of the first embodiment comprises a housing 10, a substrate 11, a laser diode driver (LDD) 12, a controller 13, a light-emitting module 14A, a heater 15A and a receptacle 16. FIG. 1 is a perspective view and FIG. 2A is a cross sectional view schematically showing the light-transmitting module 1.

The housing, which is made of alloy containing zinc and aluminum, or aluminum, encloses the substrate 11, the LDD, 12, the controller 13, the light-emitting module 14A and the heater 15A. On the front side 10a thereof is provided the receptacle 16 that receives an optical connector, which is not shown in FIG. 1 and FIG. 2A.

The substrate 11 is disposed in substantially parallel to the bottom 10b of the housing 10. On the upper surface of the substrate 11a is installed the controller 13. The LDD 12 and the controller 13 are electrically connected by a wiring pattern provided on the substrate 11. The front side of the substrate 11, a region 11b, into which the light-emitting module 14A is stored, is formed.

Figure 2B:
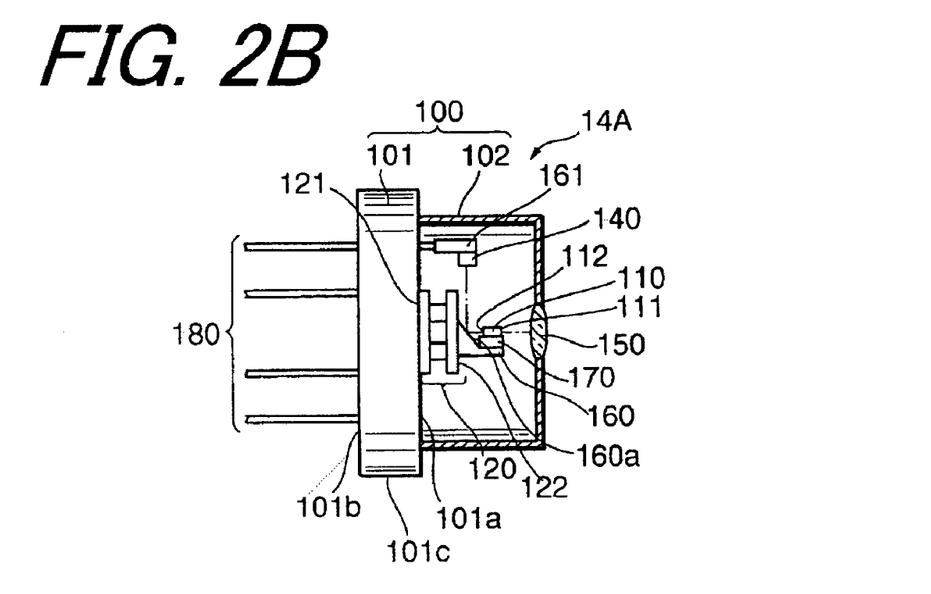
FIG. 2B is a schematic side view showing an light-emitting module according to the present invention.
Figure 3:
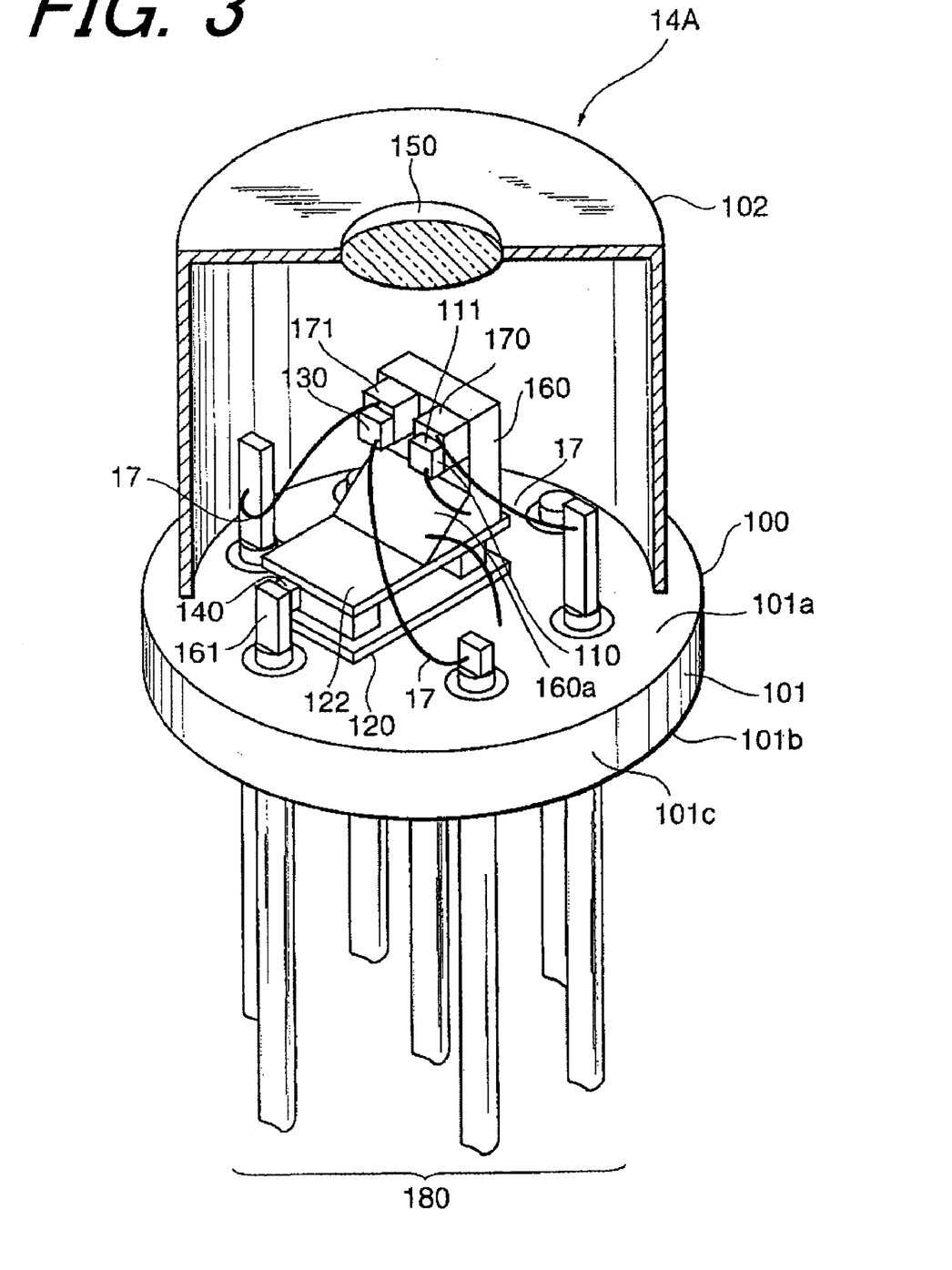
FIG. 3 is a perspective view of the light-emitting module shown in FIG. 2B.

The light-emitting module 14A has a co-axial CAN-type package. The configuration of the light-emitting module 14A will be described as referring to FIG. 2B and FIG. 3. FIG. 2B is a side view and FIG. 3 is a perspective view, both showing the configuration of the light-emitting module 14A. The light-emitting module 14A includes a package 100, a laser diode (LD) 110, a thermoelectric device 120 such as a Peltier device, a thermistor 130, a photodiode (PD) 140 and a lens 150.

The package 100 encloses the LD 110, the Peltier device 120, the thermistor 130 and then lens 150 therein. The package 100 has a stem 101 and a cap 102, both made of iron (Fe) or copper tungsten (CuW). The stem 101 has a disk shape having a mounting surface 101a and a back surface 101b opposite to the mounting surface 101a. The devices such as the LD 110, the Peltier 120 and the thermistor 130 are mounted on the mounting surface 101a, and covered by the cap 102. The cap 102 functions as a lens holder for securing the lens 150.

The Peltier device 120, which adjusts a temperature of the LD 110, is mounted on nearly center of the mounting surface 101a. On the upper surface of the Peltier device is disposed a sub-mount 16, on which the LD 110 and the thermistor 130 are mounted. The sub-mount is preferably made of material having good thermal conductivity.

The LD 110 is mounted on the sub-mount 160 via the heat sink 170 such that light emitted from the front facet 111 of the LD 110 enters the lens 150. The thermistor 130 is also mounted on the sub-mount immediately by the LD 110 via the heat sink 170 such that the thermistor 130 may monitor a temperature of the LD 110.

The PD 140 is mounted on the sub-mount 160 such that the PD can monitor light emitted from the rear facet 112 of the LD. In the present embodiment, the sub-mount 160 has an inclined surface 160a, on which a mirror is disposed and not shown in FIG. 2B. The light emitted from the rear facet 112 enters the PD 140 after reflected by the mirror.

The devices, such as the Peltier device 120, the LD 110, the thermistor 130 and the PD 140, are electrically connected to corresponding lead pin 180 with a bonding-wire 17. The lead pin 180, passing through the stem 101, is electrically and mechanically connected to the substrate 11, whereby the LD 110 is electrically connected to the LDD 12 that drives the LD via the lead pin 180 and the substrate 11. Also, the Peltier device 130 and the PD 140 are electrically connected to the driver 13 via the lead pin 180 and the substrate 11. The sub-mount 161, on which the PD is disposed, is provided on the lead pin 180.

The light-emitting module 14a thus configured is disposed in the region 11b of the substrate 11 such that the back surface 101b of the stem 101 is substantially parallel to the front wall 10a of the housing 10 and the cap 102 of the module 14a protrudes to the outside from the front wall 10a. The cap 102 protruding from the front wall 10a is positioned in the receptacle.

The heater 15A is directly mounted on the side surface 101c of the stem 101 with adhesive. The heater 15A may be a thin film heater made of ceramic and is electrically connected to the substrate 11 via the bonding-wire 17 in FIG. 1. For the configuration of the heater 15A, a groove is formed in the side surface of the stem, and the heater 15A may be put on the groove.

Figure 4:
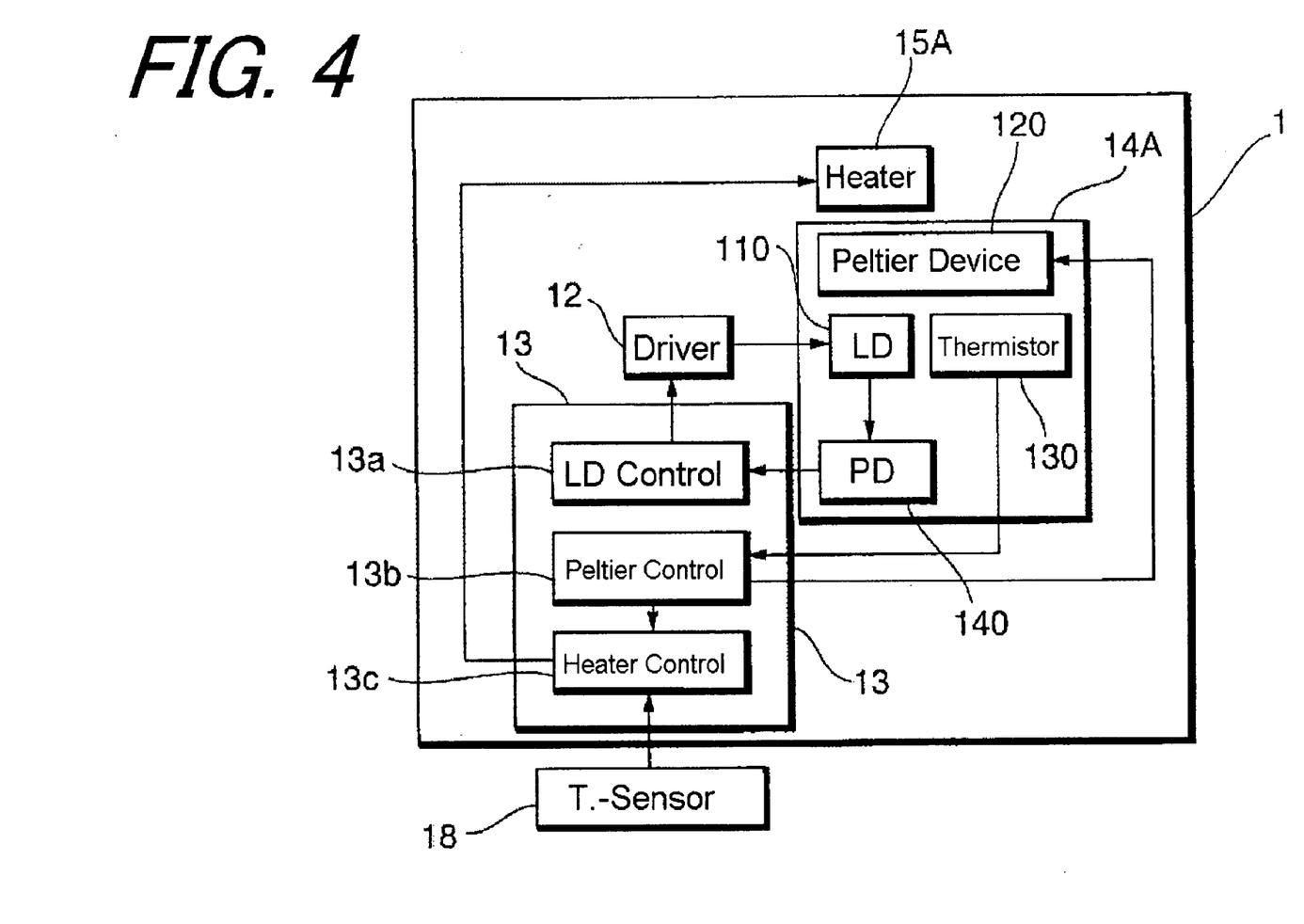
FIG. 4 is a block diagram showing the light-emitting module shown in FIG. 2.

The LDD 12, the Peltier device 120 and the heater 15A are controlled by the controller 13. Next, the operation of the controller 13 will be described as referring to FIG. 4. FIG. 4 is a functional block diagram of the light-transmitting module 1. The controller 13, as shown in FIG. 4, provides a LD controller 13a, a Peltier controller 13b, and a heater controller 13c.

The LD controller 13a is connected to the PD 140, and receives the output of the PD 140. The LD controller 13a controls the LDD 12 such that the optical output of the LD 110 is maintained to be a predetermined value.

The Peltier controller 13b is connected to both the Peltier device 120 and the thermistor 130 and receives the output of the thermistor 130. The Peltier controller 13b controls the Peltier device 120 such that the Peltier device 120 sets the temperature of the LD 110 to be a preset condition at which the LD 110 may optimally operate. Explaining in detail, when the preset temperature of the LD 110 is higher than the practical temperature of the LD 110, the Peltier controller 13b controls the Peltier device so as to heat up the upper surface thereof 122. On the other hand, the preset temperature of the LD 110 is lower than the practical temperature of the LD 110, the Peltier controller controls the Peltier device so as to cool down the upper surface thereof 122. Further, the Peltier controller inputs the preset temperature of the LD 110 to the heater controller 13c.

The heater controller 13c is connected to both sensors 18 for an ambient temperature, which is set outside of the light-transmitting module 1, and the heater 15A. The heater controller 13c compares the preset temperature of the LD 110 to the ambient temperature, and enables the heater 15A when the preset temperature is higher than the ambient temperature.

One feature of the present invention is that the heater 15A is enabled when the preset temperature of the LD 110 is higher than the ambient temperature. As described, when the preset temperature of the LD 110 is higher than the ambient temperature, the Peltier controller 13b controls the Peltier device such that, as shown in FIG. 2B, so as to heat up the upper surface 122 of the Peltier device 120. Therefore, due to the intrinsic property of the Peltier device 120, the lower surface 121 thereof in contact with the mounting surface 101a is lowered in its temperature. Further, the light-emitting module 14a has the package 100 made of metal, namely, the package 100 shows a good thermal conductivity. The stem 101 has lead pins 180 in its back surface 101b. Therefore, the temperature of the stem 101 and that of the lead pins are also lowered as the temperature of the lower surface 121 of the Peltier device 120 decreases.

In the present embodiment, however, the heater 15A is provided around the side surface 101c of the stem 101. The heater 15A operates only when the preset temperature of the LD 110 is higher than the ambient temperature, which prevents the temperature of the stem 110 and the lead pins 180 from lowering the dew-point. Therefore, no droplets may be generated on the substrate 11, thereby escaping from the short circuit or the breaking of the wiring and enabling the light-transmitting module to output light in reliable.

Figure 5A:
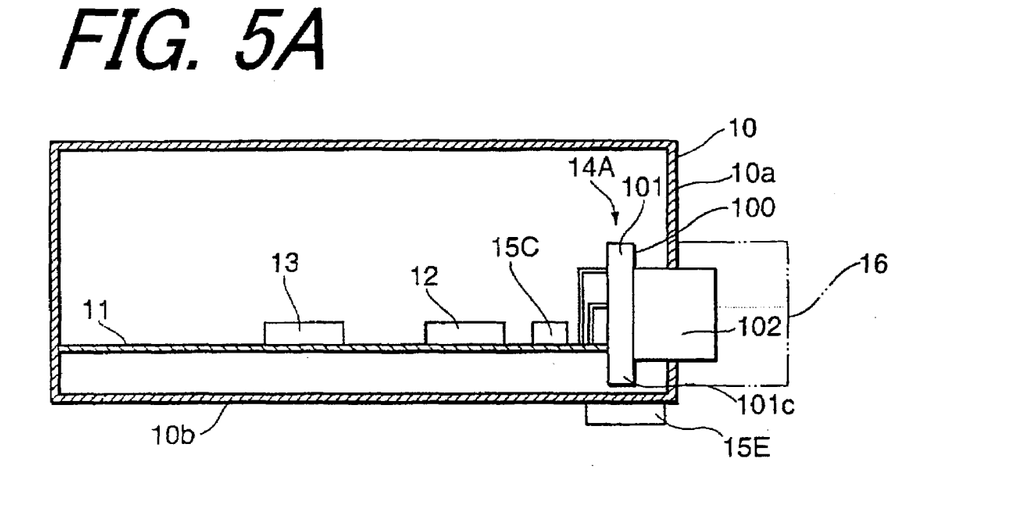
FIG. 5A is a schematic cross sectional view showing the light-emitting module having a modified arrangement of the heater.
Figure 5B:
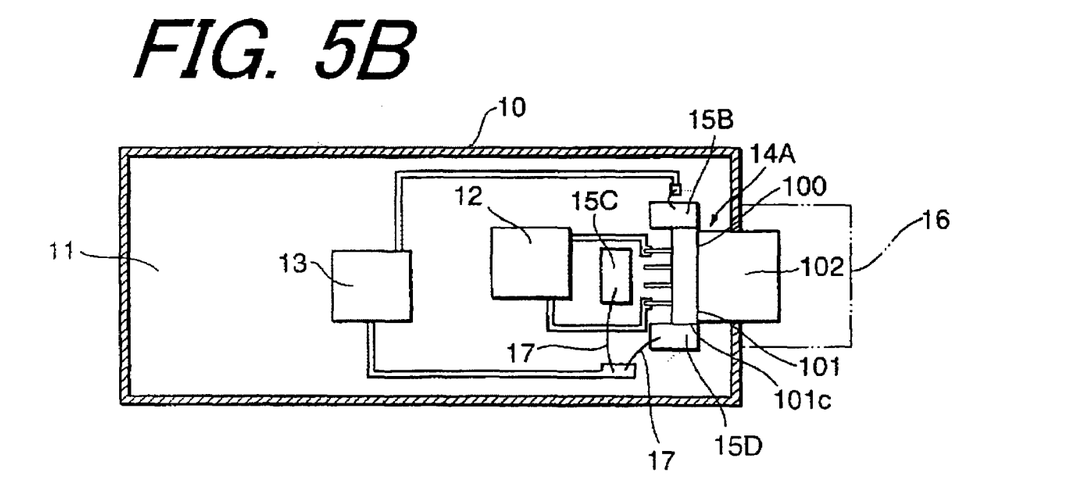
FIG. 5B is a cross sectional plan view of the light-emitting module shown in FIG. 5A.

Although the heater 15A is disposed on the side surface 101c of the stem 101 in the present embodiment, the position of the heater 15A is not restricted thereto. A region thermally in contact with the outer surface of the package 100 or an are adjacent to the region may be applicable to set the heater 15A. FIG. 5A and FIG. 5B schematically show examples of the arrangement of the heaters from 15C to 15E. The heater 15c is disposed adjacent to the lead pin 180 on the substrate 11, in which the heater 15c warms the lead pin 180 and the stem 101 in contact with the lead pin 180. The heaters 15C, 15D are disposed on the substrate 11 and come in contact with the side of the stem 101c, in which the heaters 15C, 15D warm the stem 101. Further, the heater 15E is disposed in the outer surface of the bottom 10b close to the side 101c of the stem 101, where the heater 15E warms the outer surface of package 100 via the housing 10. In these arrangements, since the heater 15B to 15D can warm the lead pin and the stem 101, the condensation can be prevented.

(Second Embodiment)

Figure 6:
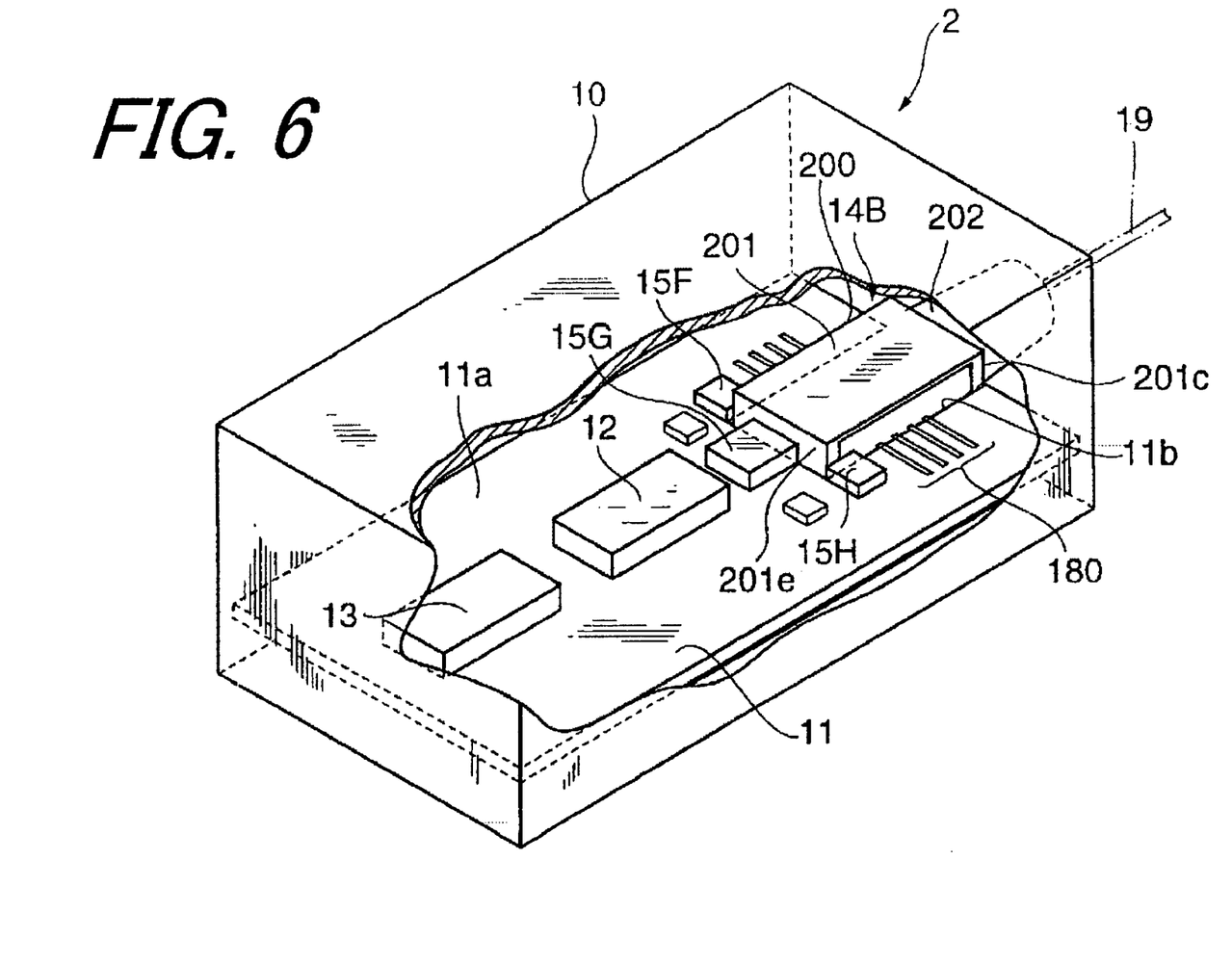
FIG. 6 is a schematic perspective view showing the second embodiment according to the present invention.

Next, the second embodiment of the present invention will be described as referring to from FIG. 6 to FIG. 7. FIG. 6 is a perspective view of the light-transmitting module 2 according to the second embodiment, FIG. 7A and FIG. 7B are schematically shown cross sectional view.

Figure 7A:
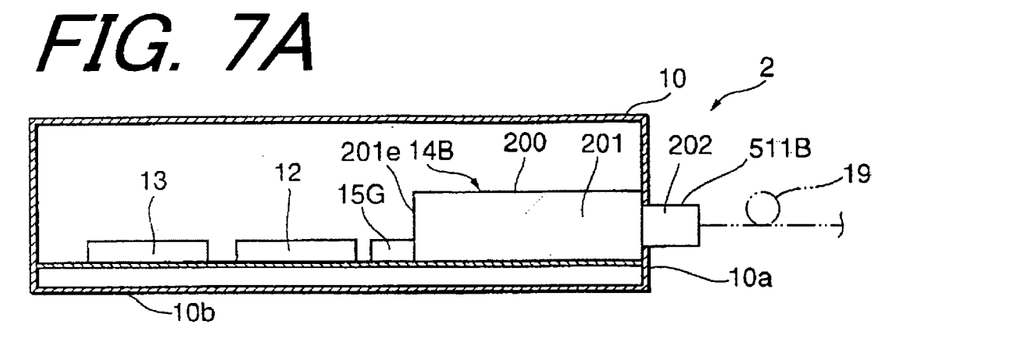
FIG. 7A is a schematic cross sectional view taken from the side of the light-emitting module shown in FIG. 5.
Figure 7B:
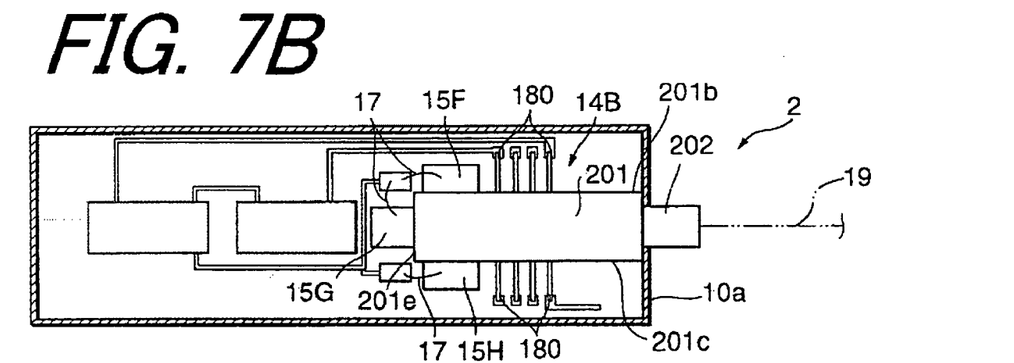
FIG. 7B is a schematic cross sectional view of the light-emitting module shown in FIG. 5 taken from the upper thereof.

The light-transmitting module 2 has different aspects to the first embodiment, that the module 2 has a butterfly type housing and heaters from 15F to 15H, as shown in FIG. 7A and FIG. 7B, are disposed on the substrate 11.

Figure 7C:
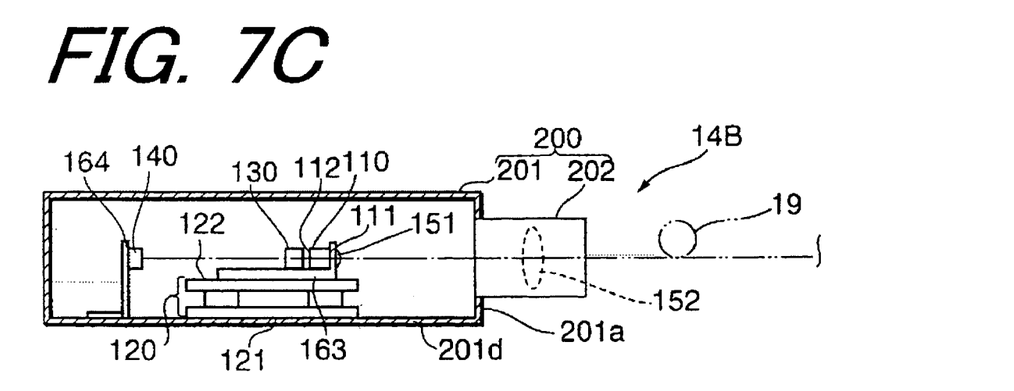
FIG. 7C is a schematic side view of the light-emitting module.
Figure 8:
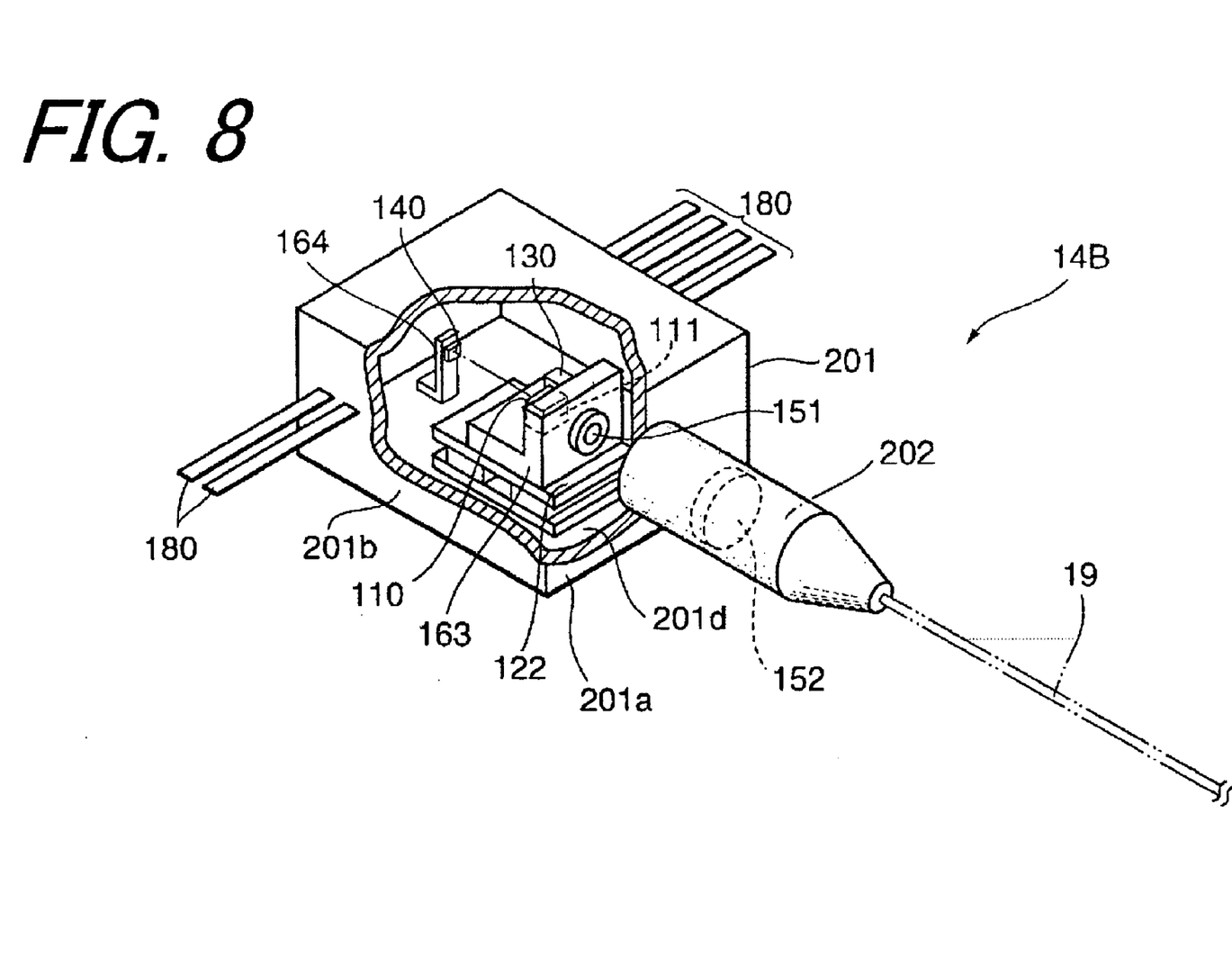
FIG. 8 is a perspective view showing the light-emitting module according to the second embodiment.

A light-emitting module 14B of the second embodiment will be explained as referring to FIG. 7C and FIG. 8. FIG. 7C is a schematic cross sectional view and FIG. 8 is a perspective view of the light-emitting module 14B. The module 14B has a package 200, an LD 110, a Peltier device 120, a thermistor 130 and a photodiode 140.

The package 200 comprises a box portion 202 and a cylindrical portion 202. The box portion encloses the LD 110, the Peltier device 120, the thermistor 130 and the PD 140 therein. The cylindrical portion 202 is provided in the front wall 201a of the box portion 201 and supports the optical fiber 19. The side walls 201b, 201c of the box portion 201 disposes the lead terminal 180.

The bottom 201d of the box portion 201 installs the Peltier device 120. The geometrical arrangement of the LD 110 and the thermistor 130 on the Peltier device is same as those of the first embodiment, namely, the Peltier device 120 installs the sub-mount 163 on the upper surface 122 thereof, and the sub-mount 163 mounts the LD 110 thereon. The sub-mount has an L-shape, one side of which faces and is in contact with the upper surface 122 of the Peltier device, and the other side of the sub-mount provides a lens 151. Light emitted from the front facet 111 of the LD 110 enters the cylindrical portion 202 passing through the lens 151. The thermistor 130 is provided adjacent to the LD 110 on the sub-mount 163.

The PD 140 is positioned, similar to the first embodiment, so as to receive the light emitted from the rear facet 112 of the LD. Referring to FIG. 8, the PD 140 is installed on the bottom 201d of the box portion 201 via an L-shaped sub-mount 163.

Within the cylindrical member 201 is provided another lens 152 for concentrating the light emitted from the LD 110 on the tip of the optical fiber 19. A ferrule and a ferrule holder, they are not shown in FIG. 8, are provided in the cylindrical portion 202.

Thus configured light-emitting module is positioned on the substrate 11 such that the tip of the cylindrical portion 202 thereof protrudes from the front wall 10a of the housing 10 and the lead pin 180 of the light-emitting module is electrically and mechanically connected to the substrate 11. Since the devices in the package, the LD 110, the Peltier device 120 and the thermistor 130, are electrically connected to the lead pin 180, the LD 110 is connected to the LDD 12 disposed outside the light-emitting module 14a, the Peltier device 120, the thermistor 130 and the PD 140 are connected to their controller, respectively.

The heaters from 15F to 15H, as shown in FIG. 7B, are disposed on the substrate 11 so as to come in contact with the outer surface of the box portion 201 of the light-emitting module 14B. The heaters 15F, 15H are disposed adjacent to the lead pin 180, while the heater 15G is arranged so as to come in contact with the rear wall 201e of the box portion 201. These heaters from 15F to 15H are respectively connected to the controller 13 via the bonding wires 17 and the substrate 13. The heaters may be a thin film heater, which are similar to those described in the first embodiment.

The function and the operation of the controller 13 are equivalent to that of the first embodiment except that the heater controller 13c controls the heaters from 15F to 15H. The heater controller 13c activates the heaters from 15F to 15H when the preset temperature of the LD 110 is higher than the ambient temperature.

In the present embodiment, since the heaters 15F to 15H installed on the substrate 11 come in directly contact with the box portion 201, the lead pin 180, the outer surface of the box portion 201 and the substrate are efficiently heated. Therefore, even when the upper surface of the Peltier device is warmed up, in other words, the lower surface of the Peltier device is cooled down, the outer surface of the box portion 201 and the lead pin 180 maybe prevented to lower the temperature thereof below the dew-point. Accordingly, even when the light-transmitting module 2 is operated in the ambient temperature lower than the preset temperature of the LD 110, the module can output light in stable and reliable.

In the second embodiment thus described, the LDD 12 is disposed outside the light-emitting module. However, the LDD 12 is not restricted to such arrangement, namely, the LDD may be installed within the light-emitting module 14B.

Figure 9:
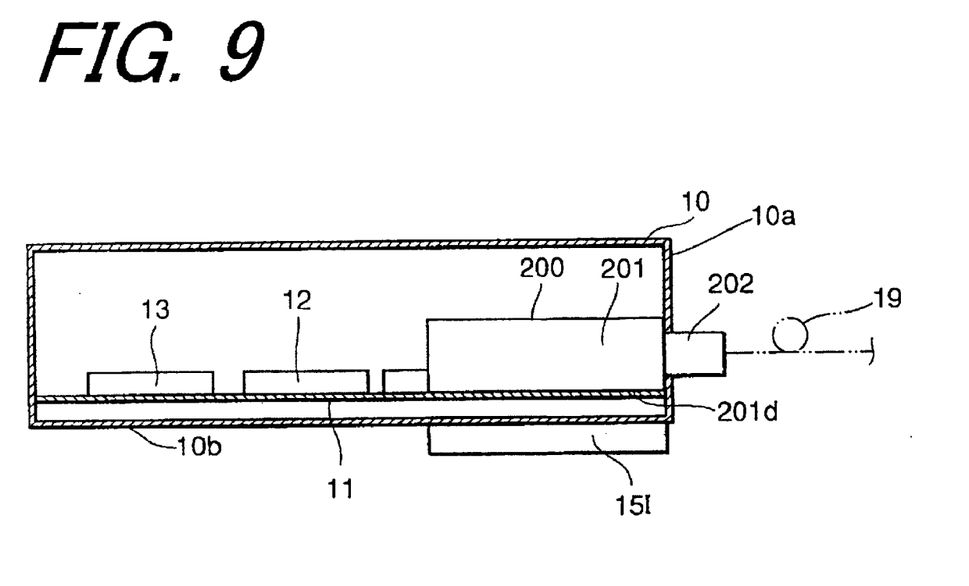
FIG. 9 is a schematic view of the light-transmitting module showing the arrangement of the heater.

The arrangement of the heater is also not limited to those shown in figures. FIG. 9 is a modification of the arrangement of the heater 151, in which the outer surface 10b of the housing located under the bottom 201d of the box portion 201 provides the heater 151. In this arrangement of the heater 151, the box portion 201 may be heated up by the heater 151 via the housing 10 because the front wall 201a of the box portion 201 comes in contact with the housing 10. Moreover, the activation of the heater 151 results on the warming up of the atmosphere in the housing, especially between the box portion 201 and the bottom 10b, via the heating of the bottom 10b, thereby preventing the temperature of the outer surface of the box portion from lowering. The planar size of the heater 151 is preferably equivalent to that of the bottom 201d of the box portion 201.

In the embodiments thus described, the light-emitting device is assumed to be the laser diode. However, the present invention does not restrict the laser diode, and the spirit of the present invention can be applicable to the light-emitting diode (LED) as the light-emitting device. When the LED is used, the LDD may include a function corresponding to the LED.

What is claimed is:

1. A light-transmitting module, comprising:
    a light-emitting module including a Peltier device, a laser diode, a package, a plurality of lead pins, and a thermistor, said laser diode being mounted on said Peltier device, said Peltier device controlling a temperature of said laser diode, said package having a CAN-type with a stem mounting said Peltier device with said laser diode, said lead pins extending from said stem, said thermistor being disposed immediately by said laser diode on said Peltier device, said thermister monitoring said temperature of said laser diode;
    a substrate for installing a plurality of electronic elements, said lead terminals being connected to said substrate;
    a heater disposed so as to heat up said light-emitting module and said substrate; and
    a housing for receiving said light-emitting module, said substrate and said heater therein.

2. The light-transmitting module according to claim 1, wherein said heater is disposed in a side surface of said stem.

3. The light-transmitting module according to claim 1, wherein said heater is disposed on said substrate so as to come in contact with a side surface of said stem.

4. The light-transmitting module according to claim 1, wherein said heater is disposed adjacent to said plurality of lead pins.

5. The light-transmitting module according to claim 1, wherein said light-emitting module further includes
    a package having a box-shape with a pair of side walls and a rear wall;
    a plurality of lead pins extending from respective side walls; and
    a thermistor disposed immediately by said laser diode on said Peltier device, said thermistor monitoring said temperature of said laser diode.

6. The light-transmitting module according to claim 5, wherein said heater is disposed on said substrate so as to come in contact with said side wall.

7. The light-transmitting module according to claim 5, wherein said heater is disposed on said substrate so as to come in contact with said rear wall.

8. The light-transmitting module according to claim 5, wherein said heater is provided in an outer surface of said housing located under said box-shaped package.

9. The light-transmitting module according to claim 1, wherein said heater is a thin film heater.

10. The light-transmitting module according to claim 1, wherein said plurality of electronic elements includes a laser diode controller, a Peltier controller, and a heater controller.

11. The light-transmitting module according to claim 10, wherein
    said laser diode controller controls said laser diode such that an optical output of said laser diode is maintained to be a predetermined value.

12. The light-transmitting module according to claim 11, wherein said heater controller compares an ambient temperature with a preset temperature of said laser diode and, when said preset temperature is higher than said ambient temperature, enables said heater.

13. The light-transmitting module according to claim 11, wherein said Peltier controller controls said Peltier device so as to set said laser diode to be a preset temperature.

* * * * *